(12) United States Patent
He

(10) Patent No.: US 11,659,730 B2
(45) Date of Patent: May 23, 2023

(54) DISPLAY PANEL HAVING AN ENCAPSULATION LAYER COMPRISES PLURALITY OF PROTRUSIONS AND MANUFACTURING METHOD HAVING THE SAME THEREOF

(71) Applicant: WUHAN CHINA STAR OPTOELECTRONICS SEMICONDUCTOR DISPLAY TECHNOLOGY CO., LTD., Hubei (CN)

(72) Inventor: Chao He, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 483 days.

(21) Appl. No.: 16/756,932

(22) PCT Filed: Mar. 19, 2020

(86) PCT No.: PCT/CN2020/080113
§ 371 (c)(1),
(2) Date: Apr. 17, 2020

(87) PCT Pub. No.: WO2021/174598
PCT Pub. Date: Sep. 10, 2021

(65) Prior Publication Data
US 2022/0310975 A1     Sep. 29, 2022

(30) Foreign Application Priority Data

Mar. 5, 2020 (CN) .......................... 202010148380.9

(51) Int. Cl.
*H01L 29/08* (2006.01)

(52) U.S. Cl.
CPC ......... *H10K 50/85* (2023.02); *H10K 50/8445* (2023.02); *H10K 71/00* (2023.02)

(58) Field of Classification Search
CPC .. H01L 51/56; H01L 51/5256; H01L 51/5262
(Continued)

(56) References Cited

U.S. PATENT DOCUMENTS

| 10,790,474 B2 | 9/2020 | Lee et al. |
| 2009/0302744 A1 | 12/2009 | Kim et al. |

(Continued)

FOREIGN PATENT DOCUMENTS

| CN | 208970564 U | 6/2019 | |
| CN | 110350003 A | * 10/2019 | ........... H01L 27/322 |

(Continued)

*Primary Examiner* — Phuc T Dang
(74) *Attorney, Agent, or Firm* — Dickinson Wright PLLC

(57) ABSTRACT

The disclosure provides a display panel and a manufacturing method thereof. The display panel includes a substrate, a luminescent layer, and an encapsulation layer. The encapsulation layer includes a plurality of protrusions or a plurality of recesses. The protrusions or the recesses are formed on a side of the encapsulation layer away from the substrate. Because the protrusions are formed from cured ink, a manufacturing process is simple and costs are reduced. Furthermore, the protrusions may increase a ratio of light usage of the display panel and improve display quality of the display panel.

18 Claims, 4 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2014/0027725 A1 | 1/2014 | Lim et al. | |
| 2014/0034919 A1 | 2/2014 | Park et al. | |
| 2014/0183462 A1* | 7/2014 | Lee | H01L 51/5256 257/40 |
| 2015/0171371 A1* | 6/2015 | Jeon | H01L 51/5275 257/40 |
| 2019/0267440 A1* | 8/2019 | Park | H01L 27/3262 |

FOREIGN PATENT DOCUMENTS

| | | | |
|---|---|---|---|
| CN | 110400889 A | | 11/2019 |
| CN | 110429195 A | | 11/2019 |
| CN | 209785979 U | | 12/2019 |
| CN | 110880560 A | | 3/2020 |
| CN | 111276515 A | | 6/2020 |
| CN | 111370592 A | | 7/2020 |
| JP | 2004227940 A | | 8/2004 |
| KR | 20160034510 A | * | 3/2016 |

* cited by examiner

DISPLAY PANEL HAVING AN ENCAPSULATION LAYER COMPRISES PLURALITY OF PROTRUSIONS AND MANUFACTURING METHOD HAVING THE SAME THEREOF

FIELD

The present disclosure relates to the field of display technologies, and more particularly, relates to a display panel and a manufacturing method thereof.

BACKGROUND

Organic light-emitting diode (OLED) display devices have been widely used in various fields due to advantages such as thin body, self-luminescence, wide viewing angles, lower power consumption, and eco-friendly properties.

OLED display panels consist of multiple layers including a glass substrate, a plurality of functional layers, etc. Different layers have different light transmittance, wherein some layers have good light transmittance, while some layers have poor light transmittance. When light is transmitted in such layers, about 80% of the light cannot be emitted into air because of reflection and refraction, thereby reducing light transmittance of the OLED display panels, and affecting display quality. To improve luminous efficiency of the OLED display devices, an electrode structure of the OLED display devices is changed by conventional technologies. For example, adding a light extraction layer into the OLED display devices, or etching a surface of a substrate to form some microstructures. However, the above designs can only slightly increase light extraction efficiency of the OLED display devices and are complicated, which are not beneficial to an actual manufacturing process. Moreover, the designs are too complex for flexible display panels.

In summary, light extraction efficiency and light output ratio of conventional display panels are low because a large number of photons cannot be emitted into the air when light is transmitted in different layers. Display effect and quality of the conventional display panels cannot meet expectations, and manufacturing processes thereof are complicated.

SUMMARY

The present disclosure provides a display panel and a manufacturing method thereof to solve problems in conventional display panels such as massive loss of photons in such layer, low light extraction efficiency, low light out ratio, poor display effect, bad quality, and complicated manufacturing processes.

To solve the above technical problems, technical solutions provided by embodiments of the present disclosure are described as follows.

According to a first aspect of the present disclosure, a display panel is provided, including a substrate; a luminescent layer disposed on the substrate; and an encapsulation layer disposed on the luminescent layer.

The encapsulation layer includes a plurality of protrusions and a plurality of recesses, and the protrusions or the recesses are disposed on the side of the encapsulation layer away from the substrate.

According to one embodiment of the present disclosure, the protrusions or the recesses are disposed on a side of the encapsulation layer away from the substrate in an array arrangement.

According to one embodiment of the present disclosure, a top of the protrusions has a curved surface.

According to one embodiment of the present disclosure, a contact angle between the curved surface of the protrusions and a surface of the encapsulation layer ranges from 30° to 70°.

According to one embodiment of the present disclosure, the protrusions are disposed in a luminescent display area corresponding to the encapsulation layer of the display panel.

According to one embodiment of the present disclosure, a distance between adjacent protrusions ranges from 20 nm to 100 nm.

According to one embodiment of the present disclosure, a height of each of the protrusions is same, or a depth of each of the protrusions is same.

According to one embodiment of the present disclosure, the height each of the protrusions ranges from 20 nm to 1000 nm.

According to one embodiment of the present disclosure, a material of the protrusions includes one of an acrylic resin, a methacrylic resin, or an isoprene resin, or a material of the recesses includes one of the acrylic resin, the methacrylic resin, or the isoprene resin.

According to one embodiment of the present disclosure, the encapsulation layer includes at least one inorganic layer and at least one organic layer, and the at least one inorganic layer and the at least one organic layer are alternately stacked.

According to one embodiment of the present disclosure, the at least one inorganic layer is disposed on a side of the encapsulation layer adjacent to the luminescent layer, and the at least one inorganic layer is disposed on a side of the encapsulation layer away from the luminescent layer.

According to one embodiment of the present disclosure, the encapsulation layer includes a first inorganic layer, a first organic layer, a second inorganic layer, a second organic layer, and a third inorganic layer. The first inorganic layer is disposed on the luminescent layer, the first organic layer is disposed on the first inorganic layer, the second inorganic layer is disposed on the first organic layer, the second organic layer is disposed on the second inorganic layer, and the third inorganic layer is disposed on the second organic layer.

According to one embodiment of the present disclosure, a material of the at least one inorganic layer of the encapsulation layer includes a metal oxide and a non-metal oxide.

According to a second aspect of the present disclosure, a manufacturing method of the display panel is provided, including following steps:

S100: providing a substrate, and forming a luminescent device layer of an organic light-emitting diode (OLED) on the substrate;

S101: forming an encapsulation layer on the luminescent device layer, and orderly coating ink on the encapsulation layer;

S102: irradiating the ink to cure the ink to form a plurality of protrusions; and S103: performing an encapsulation process to finish manufacturing the display panel.

According to one embodiment of the present disclosure, in the S101, the ink is coated on the encapsulation layer by an inkjet printing method, and the ink includes an organic resin material that is cured by ultraviolet light to form a polymer.

According to one embodiment of the present disclosure, in the S101, the ink is coated on the encapsulation layer by an inkjet printing method to form the protrusions.

According to one embodiment of the present disclosure, in the S101, an inorganic encapsulation layer and an organic encapsulation layer are sequentially formed on the luminescent device layer.

According to one embodiment of the present disclosure, when the inorganic encapsulation layer and the organic encapsulation layer are sequentially formed on the luminescent device layer, the inorganic encapsulation layer is formed by a chemical vapor deposition method.

According to one embodiment of the present disclosure, when the inorganic encapsulation layer and the organic encapsulation layer are sequentially formed on the luminescent device layer, the inorganic encapsulation layer is formed by a physical deposition method.

According to one embodiment of the present disclosure, when the inorganic encapsulation layer and the organic encapsulation layer are sequentially formed on the luminescent device layer, the inorganic encapsulation layer is formed by an atomic layer deposition method.

Regarding the beneficial effects: the present disclosure provides a display panel and a manufacturing method thereof. Organic ink is orderly printed on an encapsulation layer of the display panel in an array arrangement. After the organic ink is cured by irradiation, protrusions are formed in an array arrangement. Light will be reflected or refracted by the protrusions, so that more light can be emitted into the air, thereby effectively increasing light output ratio of the display panel, reducing loss of light in layers, and improving display quality of the display panel. Furthermore, the manufacturing method of the display panel is simple, and manufacturing costs of the display panel are low.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

Figure 1:
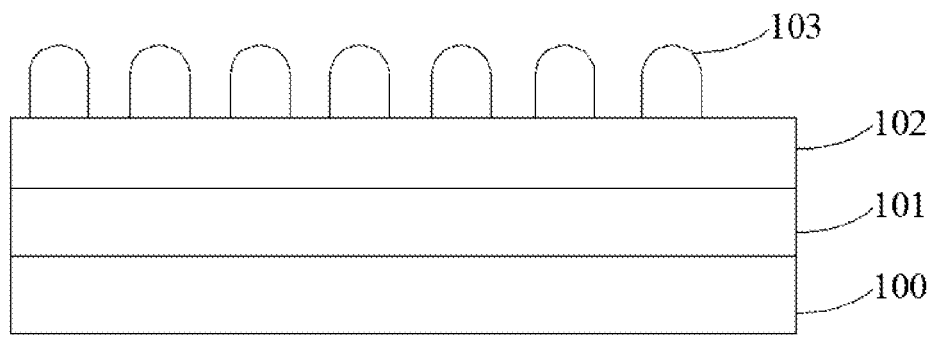
FIG. 1 is a schematic structural view showing each layer of the display panel according to an embodiment of the present disclosure.

An embodiment of the present disclosure provides a display panel. As shown in FIG. 1, a schematic structural view showing each layer of the display panel is provided. The display panel includes a substrate 100, a luminescent layer 101, and an encapsulation layer 102. The luminescent layer 101 is disposed on the substrate 100, and the encapsulation layer 102 is disposed on the luminescent layer 101.

In the present embodiment, a plurality of protrusions 103 are disposed on the encapsulation layer 102, wherein the protrusions 103 are on a side of the encapsulation layer 102 away from the substrate 100. When light passes through the protrusions 103, light will be reflected or refracted again by the protrusions 103; that is, the light can be emitted from a panel in multiple directions. Therefore, a number of light paths is increased. Furthermore, because more light is emitted outside the display panel, loss of light in layers of the display panel is reduced, and a ratio of light usage is increased.

Specifically, the display panel includes a plurality of layers. For example, the substrate 100 may further include a base plate layer and a thin film transistor (TFT) array substrate. The TFT array substrate is disposed on the base plate layer, the base plate layer may be a double-layer flexible base plate, and a material of the base plate layer may be polyimide to enhance performance.

As for the TFT array substrate, it includes a gate, a source, a drain, and a plurality of insulating layers between the above three electrodes. Furthermore, a planarization layer, a pixel defining layer, and an anode layer therebetween are disposed on the insulating layers. Moreover, the planarization layer and the pixel defining layer are patterned by photolithographic processes of exposure, development, etching, and stripping.

The luminescent layer 101 further includes other layers such as a color resist layer. In the present embodiment, the luminescent layer 101 is disposed on the pixel defining layer which has a plurality of pixel openings after being patterned. An organic luminescent material is vapor-deposited on the pixel openings, and color resists with different colors, namely red color resists, blue color resists, and green color resists, are disposed on areas corresponding to the pixel openings to realize a function of displaying multiple colors.

Figure 2:
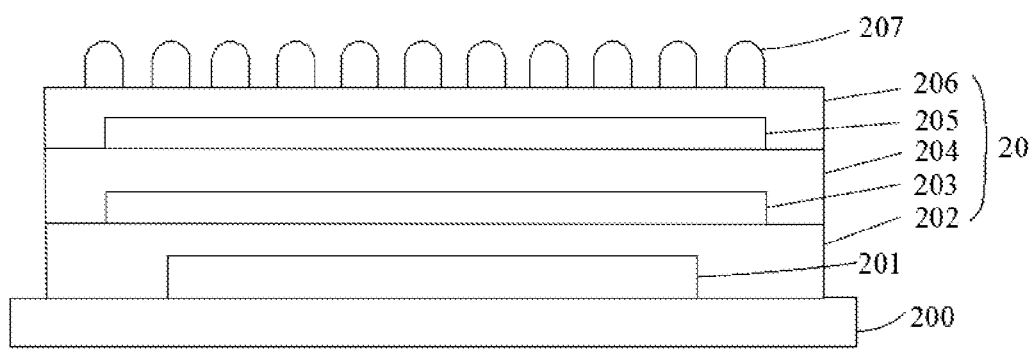
FIG. 2 is a schematic structural view showing a display panel according to another embodiment of the present disclosure.

As shown in FIG. 2, a schematic structural view showing a display panel according to another embodiment is provided. The display panel includes a substrate 200, a luminescent layer 201, an encapsulation layer 20, and a plurality of protrusions 207. The luminescent layer 201 is disposed on the substrate 200, and the encapsulation layer 20 is disposed on the luminescent layer 201 and covers the luminescent layer 201.

The encapsulation layer 20 and the protrusions 207 are disposed after the substrate 200 and the luminescent layer 201 are disposed. Specifically, in the present embodiment, to ensure an encapsulation effect of the encapsulation layer 20, the encapsulation layer 20 includes a first inorganic layer 202, a first organic layer 203, a second inorganic layer 204, a second organic layer 205, and a third inorganic layer 206. The first inorganic layer 202 is disposed on the luminescent layer 201, the first organic layer 203 is disposed on the first inorganic layer 202, and the second inorganic layer 204 is disposed on the first organic layer 203 and covers the first organic layer 203. Furthermore, the third inorganic layer 206 is disposed on an outermost side, which is a side away from the luminescent layer 201, of the encapsulation layer 20.

The encapsulation layer 20 is formed from a plurality of organic layers and a plurality of inorganic layers, which are alternately stacked. The inorganic layers and the organic layers not only can effectively encapsulate each layer of the display panel to ensure the encapsulation effect of the display panel, but also can prevent cracks from occurring on the encapsulation layer 20. As a result, performance of the encapsulation layer 20 is further enhanced.

The inorganic layers of the encapsulation layer 20 may include metal oxides and non-metal oxides. For example, the encapsulation layer 20 may include one or more of alumina, titanium oxide, silicon oxide, and nitride.

Furthermore, light emitted from the luminescent layer 101 will pass through different layers and will finally enter the air. However, the light will be lost when it travels through the layers. In other words, a portion of the light cannot be emitted into the air, leading to a low ratio of light usage and poor display quality.

Figure 3:
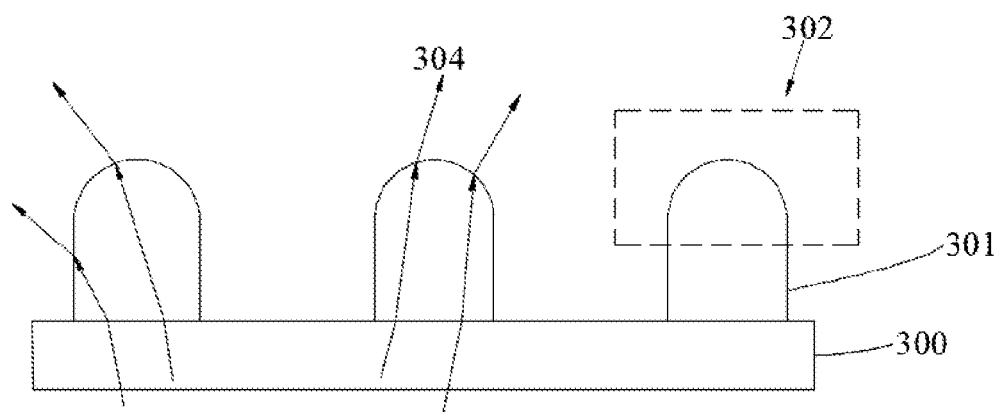
FIG. 3 is a schematic structural view showing protrusions according to an embodiment of the present disclosure.

In one embodiment of the present disclosure, as shown in FIG. 3, a schematic structural view showing protrusions is provided. A plurality of protrusions 301 is disposed on an encapsulation layer 300, wherein the protrusions 301 are formed from ink, thereby simplifying a manufacturing process.

Specifically, the protrusions 301 are disposed on a surface an outermost side of the encapsulation layer 300. To ensure consistency of layers, the protrusions 301 may be equally spaced apart from each other on the surface of the encapsulation layer 300 in an array arrangement, wherein the array arrangement may be a row array arrangement, a column array arrangement, or a ring array arrangement. The surface of the outermost side of the encapsulation layer 300 is uneven because of the protrusions 301, thereby increasing a ratio of light usage.

Preferably, in the array, a distance between two adjacent protrusions 301 ranges from 20 nm to 100 nm, a height of the protrusions 301 ranges from 20 nm to 1000 nm, and the height of each of the protrusions 301 may be same to simplify a manufacturing process. On the surface of the encapsulation layer 300, an occupation ratio of the protrusions 301 preferably ranges from 50% to 100%, thereby allowing as much light to be emitted to the air from the protrusions 301 as possible.

To improve luminous efficiency, a top of the protrusions 301 may be a curved shape able to diffuse light widely, which is similar to microlenses. Furthermore, the protrusions 301 are disposed in a display area corresponding to the display panel, thereby ensuring the display panel with exceptional display effect.

A bottom of the protrusions 301 is connected to the encapsulation layer 300, a connecting part may be a protrusion or a cylinder which have relatively low height, and a top of the protrusion or the cylinder is a curved surface.

Preferably, a contact angle between a bottom of the curved surface and the protrusion or the encapsulation layer 300 ranges from 30° to 70°.

When light 304 reaches the encapsulation layer 300 from the luminescent layer and enters the protrusions 301, it will be refracted or reflected by layers. After that, the protrusions 301 refract the light 301 again and expand a luminous area, thereby increasing luminous efficiency of the display panel and improving display quality.

Figure 4:
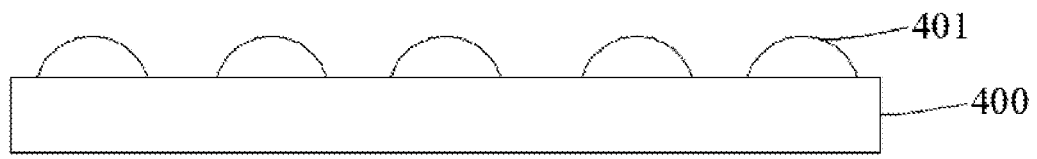
FIG. 4 is a schematic structural view showing protrusions according to another embodiment of the present disclosure.
Figure 5:
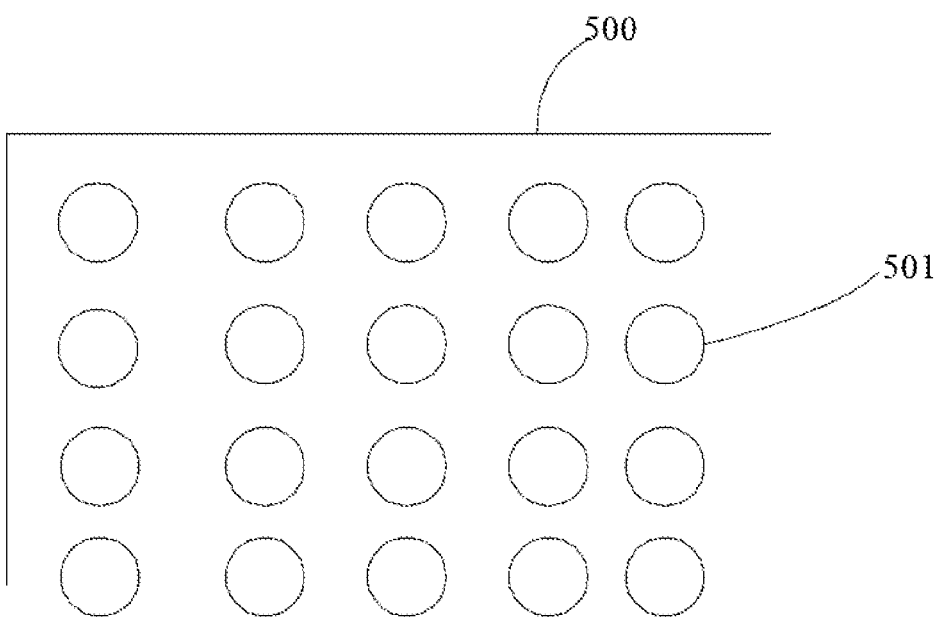
FIG. 5 is a schematic top view showing the protrusions according to the embodiment of the present disclosure.

A specific shape of the protrusions 301 is not limited to the shapes and structures disclosed by the above embodiments. The protrusions 301 may also be a recess structure, a jagged structure, a semi-circular structure, a trapezoidal structure, a combination thereof, or other structures. As shown in FIG. 4, a schematic structural view showing protrusions according to another embodiment is provided. A plurality of semi-circular protrusions 401 are disposed on an encapsulation layer 400 in an array arrangement. FIG. 5 is a schematic top view showing protrusions according to an embodiment of the present disclosure. A plurality of protrusions 501 are disposed on an encapsulation layer 500 in an array arrangement.

When the protrusions are the recess structures or other structures, a depth of each of the structures may be same. Other structures are not be described here, and their objectives and functions are to introduce light emitted from the display panel, to increase a luminous area, and to improve luminous efficiency.

Specifically, a material of the protrusions may be a polymer such as an acrylic resin, a methacrylic resin, an isoprene resin, a vinyl resin, an epoxy resin, a polyurethane resin, a cellulose resin, an amidine resin, an imide resin, or a combination thereof. The above polymers will be cured and become stable after being irradiated with light.

Figure 6:
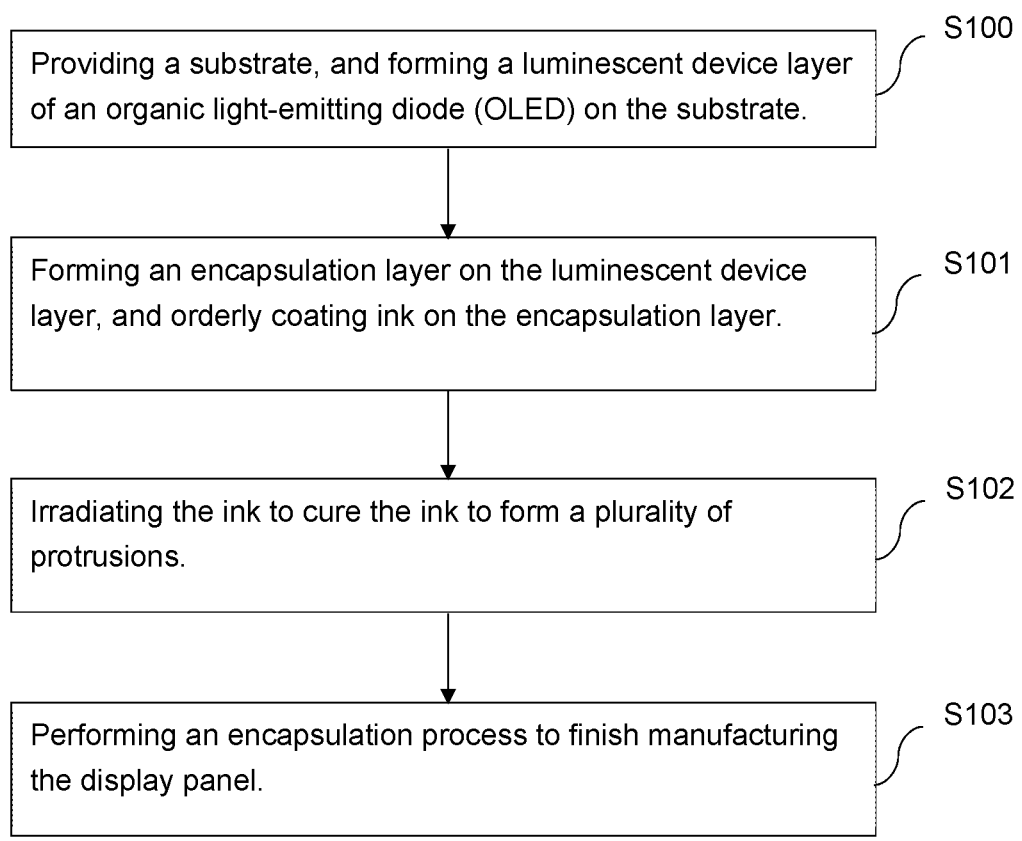
FIG. 6 is a flowchart showing a manufacturing method of a display panel according to an embodiment of the present disclosure.

As shown in FIG. 6, a flowchart showing a manufacturing method of a display panel is provided. The manufacturing method includes following steps.

S100: providing a substrate, and forming a luminescent device layer of an organic light-emitting diode (OLED) on the substrate.

In the S100, the substrate and the luminescent device layer of the OLED on the substrate may be formed according to a conventional manufacturing method, and is not described here.

S101: forming an encapsulation layer on the luminescent device layer, and orderly coating ink on the encapsulation layer.

The encapsulation layer is formed after the substrate and the luminescent layer are formed. In the present embodiment, to improve an encapsulation effect, the encapsulation layer is made of a plurality of organic layers and a plurality of inorganic layers, which are alternately stacked. Preferably, the encapsulation layer is made of three to five layers of the organic layers and the inorganic layers.

The inorganic layers of the encapsulation layer may be deposited on the luminescent layer by a chemical vapor deposition method, a physical vapor deposition method, or an atomic deposition method.

The organic layers of the encapsulation layer may be coated on the inorganic layers by an inkjet printing method, a spraying process, or a coating process.

S102: irradiating the ink to cure the ink to form a plurality of protrusions.

After the organic layers of the encapsulation layer and the inorganic layers of the encapsulation layer are formed, an outermost side of the entire encapsulation layer is the inorganic layer. Meanwhile, ink is coated on a top surface of the outermost side of the inorganic layer. Then, the ink is processed to form the protrusions mentioned in the above embodiments, thereby improving luminous effect of the display panel.

Specifically, the ink may be coated by an inkjet printing method, and the ink is coated in an array arrangement. A manufacturing process of the protrusions is simple because the inkjet printing method is simple. As a result, production efficiency of the display panel is increased. Furthermore, the inkjet printing method is flexible, so that various patterns and distributions may be flexibly designed as well.

The ink is mainly coated in a display area of the display panel, and preferably, a contact angle between the ink and a surface of the encapsulation layer ranges from 30° to 70°.

The ink is irradiated with light after being coated, and the light may be ultraviolet (UV) light. The ink will be cured after being irradiated with the UV light, and the protrusions mentioned in the above embodiments are formed after an irradiating process. Because the ink is coated in an array arrangement, the protrusions are also formed in an array arrangement.

Preferably, a material of the ink is organic ink such as curable monomer materials, which form a polymer when being cured by irradiating with light. Preferably, a material of the protrusions may be a polymer such as an acrylic resin, a methacrylic resin, an isoprene resin, a vinyl resin, an epoxy resin, a polyurethane resin, a cellulose resin, an amidine resin, an imide resin, or a combination thereof.

S103: performing an encapsulation process to finish manufacturing the display panel.

After the protrusions are formed, the entire display panel is encapsulated and protected by a cover plate. Finally, the display panel is formed.

The display panel and the manufacturing method thereof have been described in detail with embodiments provided by the present disclosure. However, the description of the above embodiments is only for helping to understand the technical solution of the present disclosure and core ideas thereof. It is understood by those skilled in the art that many changes and modifications to the described embodiment can be carried out without departing from the scope, and the spirit of the disclosure that is intended to be limited only by the appended claims.

What is claimed is:

1. A display panel, comprising:
   a substrate;
   a luminescent layer disposed on the substrate; and
   an encapsulation layer disposed on the luminescent layer;
   wherein the encapsulation layer comprises a plurality of protrusions and a plurality of recesses, and the protrusions or the recesses are disposed on a side of the encapsulation layer away from the substrate;
   wherein the encapsulation layer comprises at least one inorganic layer and at least one organic layer, and the at least one inorganic layer and the at least one organic layer are alternately stacked;
   wherein the at least one inorganic layer is disposed on a side of the encapsulation layer adjacent to the luminescent layer, and the at least one inorganic layer is disposed on a side of the encapsulation layer away from the luminescent layer.

2. The display panel of claim 1, wherein the protrusions or the recesses are disposed on the side of the encapsulation layer away from the substrate in an array arrangement.

3. The display panel of claim 2, wherein a top of the protrusions has a curved surface.

4. The display panel of claim 3, wherein a contact angle between the curved surface of the protrusions and a surface of the encapsulation layer ranges from 30° to 70°.

5. The display panel of claim 2, wherein the protrusions are disposed in a luminescent display area corresponding to the encapsulation layer of the display panel.

6. The display panel of claim 2, wherein a distance between adjacent protrusions ranges from 20 nm to 100 nm.

7. The display panel of claim 1, wherein a height of each of the protrusions is same, or a depth of each of the recesses is same.

8. The display panel of claim 7, wherein the height of each of the protrusions ranges from 20 nm to 1000 nm.

9. The display panel of claim 1, wherein a material of the protrusions comprises one of an acrylic resin, a methacrylic resin, or an isoprene resin, or a material of the recesses comprises one of the acrylic resin, the methacrylic resin, or the isoprene resin.

10. The display panel of claim 1, wherein the encapsulation layer comprises a first inorganic layer, a first organic layer, a second inorganic layer, a second organic layer, and a third inorganic layer; and
    the first inorganic layer is disposed on the luminescent layer, the first organic layer is disposed on the first inorganic layer, the second inorganic layer is disposed on the first organic layer, the second organic layer is disposed on the second inorganic layer, and the third inorganic layer is disposed on the second organic layer.

11. The display panel of claim 1, wherein a material of the at least one inorganic layer of the encapsulation layer comprises a metal oxide and a non-metal oxide.

12. A method of manufacturing a display panel, comprising following steps:
    S100: providing a substrate, and forming a luminescent device layer of an organic light-emitting diode (OLED) on the substrate;
    S101: forming an encapsulation layer on the luminescent device layer, and orderly coating ink on the encapsulation layer;
    S102: irradiating the ink to cure the ink to form a plurality of protrusions; and
    S103: performing an encapsulation process to finish manufacturing the display panel.

13. The method of claim 12, wherein in the S101, the ink is coated on the encapsulation layer by an inkjet printing method, and the ink comprises an organic resin material that is cured by ultraviolet light to form a polymer.

14. The method of claim 12, wherein in the S101, the ink is coated on the encapsulation layer by an inkjet printing method to form the protrusions.

15. The method of claim 12, wherein in the S101, an inorganic encapsulation layer and an organic encapsulation layer are sequentially formed on the luminescent device layer.

16. The method of claim 15, wherein when the inorganic encapsulation layer and the organic encapsulation layer are sequentially formed on the luminescent device layer, the inorganic encapsulation layer is formed by a chemical vapor deposition method.

17. The method of claim 15, wherein when the inorganic encapsulation layer and the organic encapsulation layer are sequentially formed on the luminescent device layer, the inorganic encapsulation layer is formed by a physical deposition method.

18. The method of claim 15, wherein when the inorganic encapsulation layer and the organic encapsulation layer are sequentially formed on the luminescent device layer, the inorganic encapsulation layer is formed by an atomic layer deposition method.

\* \* \* \* \*